United States Patent
Chen

(10) Patent No.: US 11,152,474 B1
(45) Date of Patent: Oct. 19, 2021

(54) SEMICONDUCTOR DEVICE AND METHOD FOR FORMING THE SAME

(71) Applicant: Vanguard International Semiconductor Corporation, Hsinchu (TW)

(72) Inventor: Chih-Yen Chen, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/854,623

(22) Filed: Apr. 21, 2020

(51) Int. Cl.
*H01L 29/40* (2006.01)
*H01L 29/417* (2006.01)
*H01L 29/778* (2006.01)
*H01L 29/66* (2006.01)
*H01L 21/02* (2006.01)

(52) U.S. Cl.
CPC .......... *H01L 29/402* (2013.01); *H01L 29/401* (2013.01); *H01L 29/407* (2013.01); *H01L 29/41775* (2013.01); *H01L 29/66431* (2013.01); *H01L 29/66462* (2013.01); *H01L 29/778* (2013.01); *H01L 29/7786* (2013.01); *H01L 21/0262* (2013.01)

(58) Field of Classification Search
CPC ......... H01L 29/66431; H01L 29/66462; H01L 29/778; H01L 29/402–407; H01L 29/41775
See application file for complete search history.

(56) References Cited

U.S. PATENT DOCUMENTS

| | | | |
|---|---|---|---|
| 10,964,788 B1 * | 3/2021 | Chen | H01L 21/32133 |
| 2008/0128752 A1 | 6/2008 | Wu | |
| 2012/0049243 A1 | 3/2012 | Wu | |
| 2013/0228787 A1 * | 9/2013 | Yamamura | H01L 29/7787 257/76 |
| 2016/0043184 A1 * | 2/2016 | Zhang | H01L 29/66068 257/77 |
| 2017/0317202 A1 * | 11/2017 | Green | H01L 21/28575 |
| 2017/0358670 A1 * | 12/2017 | Kub | H01L 21/02378 |
| 2018/0026105 A1 * | 1/2018 | Zhang | H01L 29/66462 257/367 |
| 2018/0342606 A1 * | 11/2018 | Iucolano | H01L 29/66462 |

(Continued)

OTHER PUBLICATIONS

Taiwanese Office Action and Search Report for Taiwanese Application No. 109100128, dated Apr. 16, 2021.

*Primary Examiner* — Joseph C. Nicely
(74) *Attorney, Agent, or Firm* — Birch, Stewart, Kolasch & Birch, LLP

(57) ABSTRACT

A semiconductor device is provided, including a substrate, a gate electrode, a first dielectric layer, a source field plate, a second dielectric layer, a source electrode and a drain electrode. The gate electrode is disposed on the substrate. The first dielectric layer is disposed on the gate electrode and has a first recess and a second recess. The source field plate is disposed on the first dielectric layer and extends into the first recess and the second recess. The second dielectric layer is disposed on the source field plate. The source electrode is disposed on the second dielectric layer and electrically connected to the source field plate. The drain electrode is disposed on the second dielectric layer. The first recess and the second recess are located between the gate electrode and the drain electrode.

21 Claims, 6 Drawing Sheets

(56) References Cited

U.S. PATENT DOCUMENTS

2021/0013331 A1\* 1/2021 Chen .................... H01L 29/402
2021/0111254 A1\* 4/2021 Jones .................... H01L 29/407
2021/0151571 A1\* 5/2021 Chou ................. H01L 29/7786

\* cited by examiner

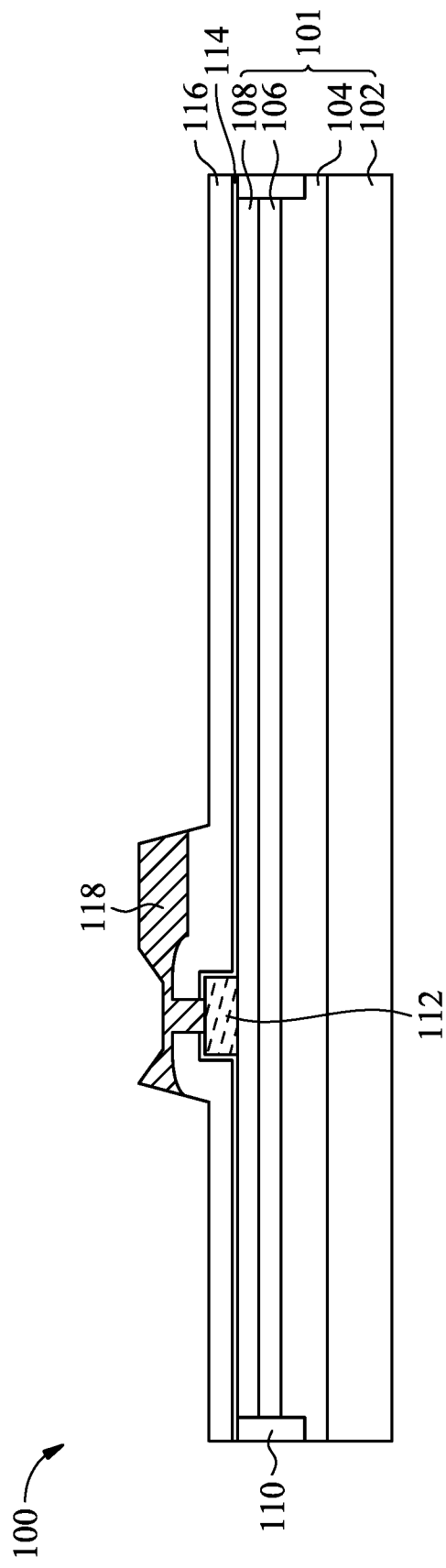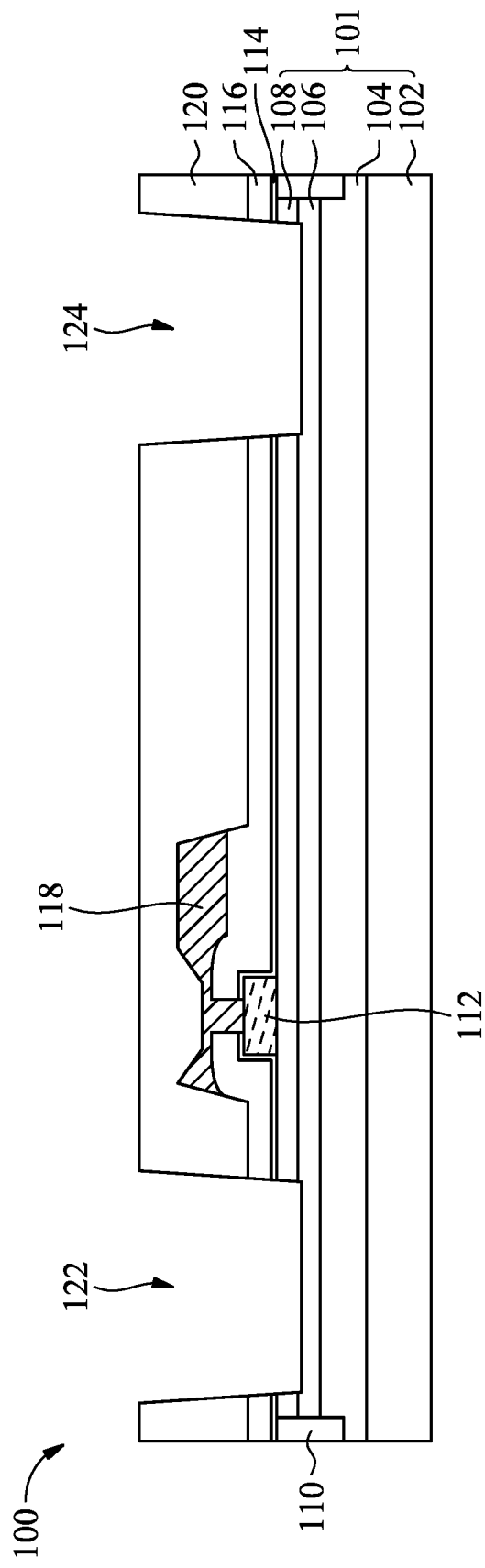
FIG. 1A
FIG. 1B

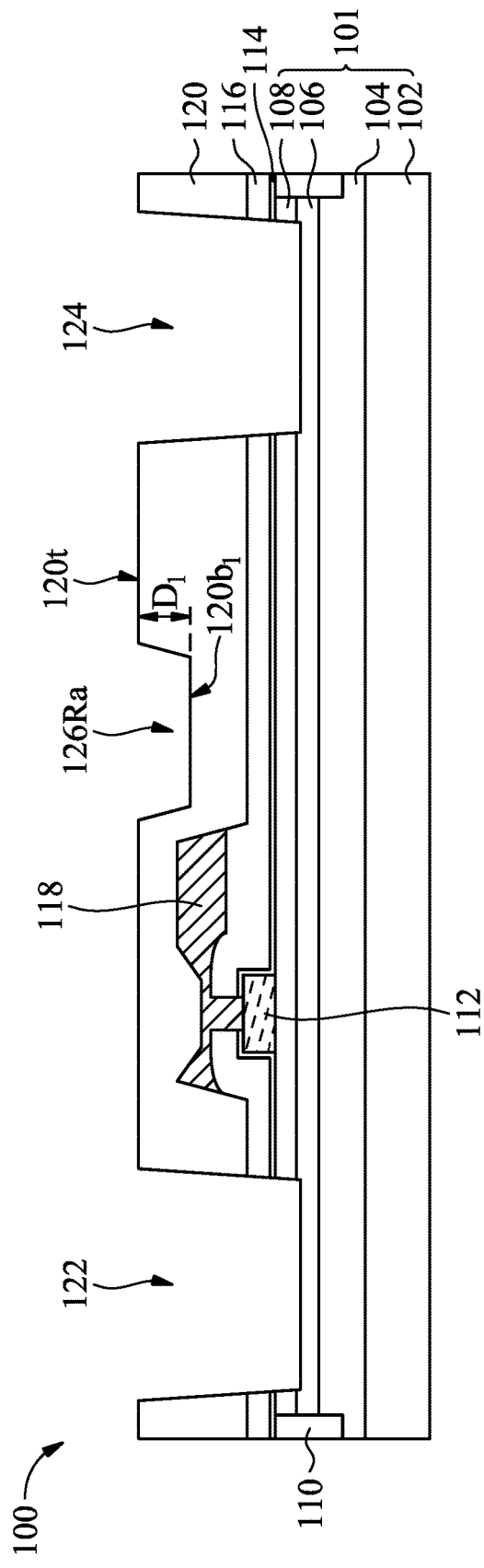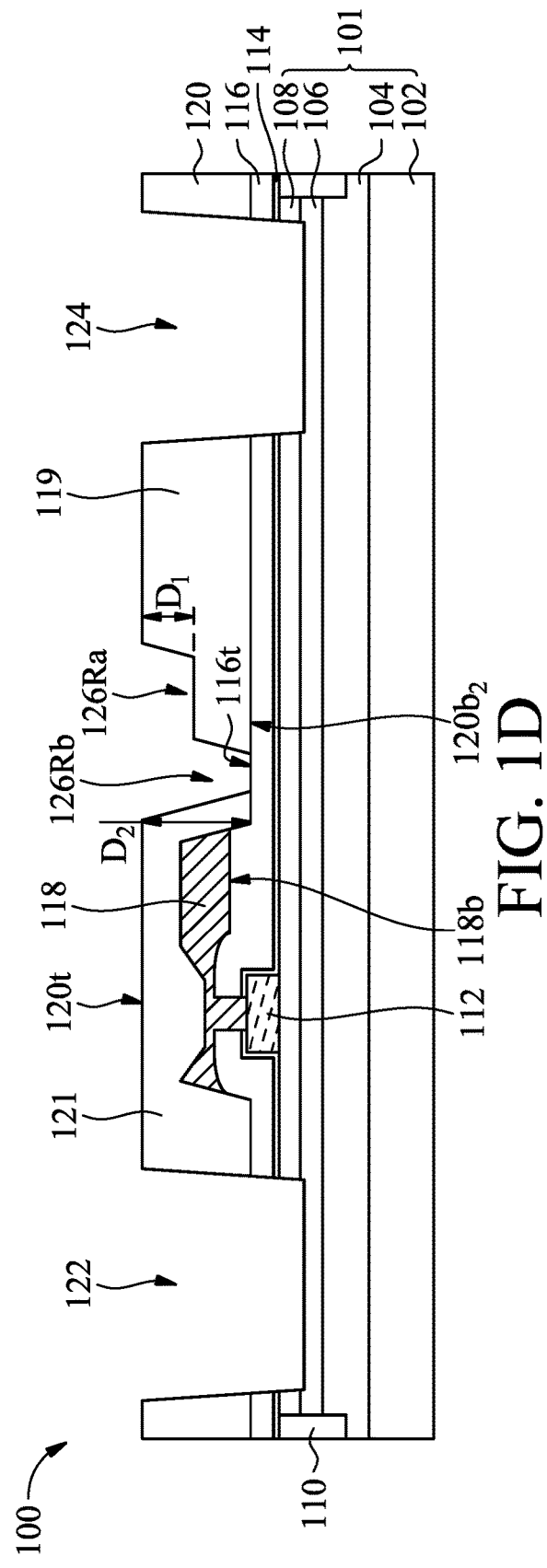
FIG. 1C
FIG. 1D

SEMICONDUCTOR DEVICE AND METHOD FOR FORMING THE SAME

BACKGROUND OF THE DISCLOSURE

Field of the Disclosure

The present disclosure relates to a semiconductor device, and in particular it relates to a high-electron-mobility transistor (HEMT) structure and a method for forming the same.

Description of the Related Art

A high-electron-mobility transistor, also called a heterostructure field effect transistor (HFET) or a modulation-doped field effect transistor (MODFET), is a field effect transistor that is composed of semiconductor materials with different energy gaps. A two-dimensional electron gas layer is generated near the interface between different semiconductor materials. The high electron mobility of the two-dimensional electron gas gives the high-electron-mobility transistor device such advantages as high breakdown voltage, high electron mobility, low on-resistance, and low input capacitance, making it suitable for use in high-power components.

Although the high-electron-mobility transistor devices that currently exist have been adequate for their intended purposes, they have not been entirely satisfactory in all respects. The development of structures and manufacturing methods that can further improve the efficiency and reliability of high-electron-mobility transistors is still one of the goals that the industry is aiming at.

BRIEF SUMMARY OF THE DISCLOSURE

In accordance with some embodiments of the present disclosure, a semiconductor device is provided. The semiconductor device includes a substrate, a gate electrode, a first dielectric layer, a source field plate, a second dielectric layer, a source electrode, and a drain electrode. The gate electrode is disposed on the substrate. The first dielectric layer is disposed on the gate electrode and has a first recess and a second recess. The source field plate is disposed on the first dielectric layer and extends into the first recess and the second recess. The second dielectric layer is disposed on the source field plate. The source electrode is disposed on the second dielectric layer and is electrically connected to the source field plate. The drain electrode is disposed on the second dielectric layer, and the drain electrode and the source electrode are disposed on opposite sides of the gate electrode. In addition, the first recess and the second recess are located between the gate electrode and the drain electrode.

In accordance with some embodiments of the present disclosure, a method for forming a semiconductor device is provided. The method for forming a semiconductor device includes the following steps: providing a substrate; forming a gate electrode on the substrate; forming a first dielectric layer on the gate electrode; removing a portion of the first dielectric layer to form a first recess in the first dielectric layer; removing another part of the first dielectric layer to form a second recess in the first dielectric layer, wherein the first recess is connected to the second recess; conformally forming a source field plate on the first dielectric layer, wherein the source field plate extends into the first recess and the second recess; forming a second dielectric layer on the source field plate; forming a source electrode on the second dielectric layer, wherein the source electrode is electrically connected to the source field plate; and forming a drain electrode on the second dielectric layer, wherein the drain electrode and the source electrode are located on opposite sides of the gate electrode.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIGS. 1A-1H are schematic cross-sectional diagrams of a semiconductor device at various stages in the manufacturing process in accordance with some embodiments of the present disclosure.

DETAILED DESCRIPTION OF THE DISCLOSURE

Figure 1E:
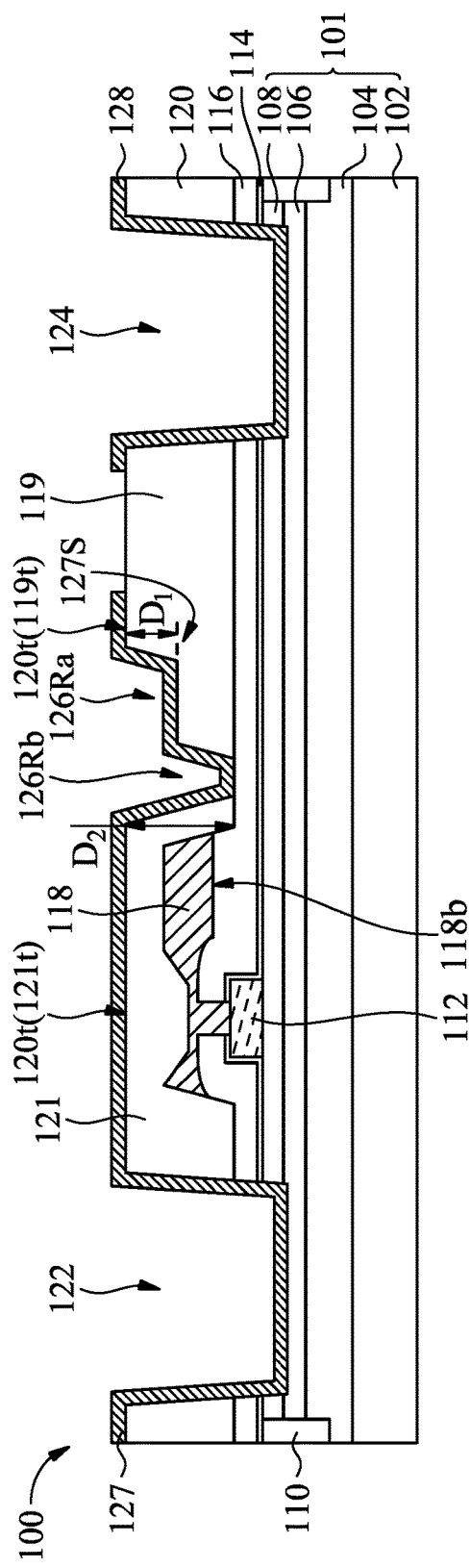

The semiconductor device and the method for forming the same provided in the embodiments of the present disclosure are described in detail in the following description. It should be understood that the following description provides many different embodiments or examples for implementing different aspects of some embodiments of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure. It should be understood that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher".

In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer. However, if the first material layer is directly on the second material layer, it means that the first material layer is in direct contact with the second material layer.

In addition, it should be understood that, although the terms "first", "second", "third" etc. may be used herein to describe various elements, components, or portions, these elements, components, or portions should not be limited by these terms. These terms are only used to distinguish one element, component, or portion from another element, component, or portion. Thus, a first element, component, or portion discussed below could be termed a second element, component, or portion without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, a provided semiconductor device includes a field plate extending into a recess in the dielectric layer, and the field plate disposed in the recess can shield the gate electrode and reduce the interference of electric field on the gate electrode. In addition, in accordance with some embodiments of the present disclosure, the field plate of the semiconductor device may have a stepped shape structure, thereby reducing the number of field plates that are disposed, reducing the capacitance generated between the gate electrode and the drain region, and simplifying the manufacturing process.

FIGS. 1A to 1H FIGS. 1A-1H are schematic cross-sectional diagrams of a semiconductor device 100 at various stages in the manufacturing process in accordance with some embodiments of the present disclosure. It should be understood that additional operations may be provided before, during, and/or after the process of forming the semiconductor device 100. In different embodiments, some of the stages described may be replaced or omitted. Additional features may be added to the semiconductor device 100. In different embodiments, some of the features of the semiconductor device 100 described below may be replaced or omitted.

Referring to FIG. 1A, a substrate 102 is provided in accordance with some embodiments. The substrate 102 may be a bulk semiconductor substrate or a composite substrate including different materials. In some embodiments, the substrate 102 may include a semiconductor substrate, a glass substrate, a ceramic substrate, a sapphire substrate, other suitable substrates, or a combination thereof. In some embodiments, the substrate 102 may include a semiconductor-on-insulator (SOI) substrate, which is formed by disposing a semiconductor material on an insulating layer.

In some embodiments where the substrate 102 is a semiconductor substrate, the substrate 102 may be formed of an elemental semiconductor material, for example, silicon (Si), germanium (Ge), or other suitable elemental semiconductor materials. In some embodiments, the substrate 102 may be formed of a compound semiconductor material, for example, silicon carbide (SiC), aluminum nitride (AlN), gallium nitride (GaN), gallium arsenide (GaAs), indium arsenide (InAs), indium phosphide (InP), or a combination thereof. In some embodiments, the substrate 102 may be made of an alloy semiconductor material, for example, germanium silicide (SiGe), silicon germanium carbide (SiGeC), gallium arsenide phosphide (AsGaP), indium gallium phosphide (InGaP), or a combination thereof. In addition, the substrate 102 may be doped (e.g., doped with p-type or n-type dopants) or undoped.

As shown in FIG. 1A, in accordance with some embodiments, a buffer layer 104 may be formed on the substrate 102 to alleviate the lattice difference between the substrate 102 and the layer that is formed on the buffer layer 104 and improve the crystalline quality. In some embodiments, the material of the buffer layer 104 may include group III-V compound semiconductor materials, such as group III nitrides. For example, in some embodiments, the material of the buffer layer 104 may include gallium nitride (GaN), aluminum nitride (AlN), aluminum gallium nitride (AlGaN), aluminum indium nitride (AlInN), other suitable buffer materials, or a combination thereof. In some embodiments, the buffer layer 104 may be formed by a chemical vapor deposition (CVD) process, a molecular beam epitaxy process, a liquid phase epitaxy process, another suitable process, or a combination thereof. The aforementioned chemical vapor deposition process may include, for example, a low-pressure chemical vapor deposition (LPCVD) process, a low-temperature chemical vapor deposition (LTCVD) process, a rapid thermal chemical vapor deposition (RTCVD) process, a plasma-enhanced chemical vapor deposition (PECVD) process, or an atomic layer deposition (ALD) process.

In addition, although the buffer layer 104 is formed directly on the substrate 102 in the embodiment shown in FIG. 1A, in some other embodiments, before the buffer layer 104 is formed, a nucleation layer (not illustrated) may be formed on the substrate 102 to further alleviate the lattice difference between the buffer layer 104 and the substrate 102 and improve the crystalline quality. In some embodiments, the material of the nucleation layer may include group III-V compound semiconductor materials, such as group III nitrides.

In accordance with some embodiments, a channel layer 106 may then be formed on the buffer layer 104. In some embodiments, the material of the channel layer 106 may include one or more group III-V compound semiconductor materials, such as group III nitrides. For example, in some embodiments, the material of the channel layer 106 may include gallium nitride (GaN), aluminum gallium nitride (AlGaN), indium gallium nitride (InGaN), aluminum gallium indium nitride (AlGaInN), another suitable material, or a combination thereof. Furthermore, the channel layer 106 may be doped (e.g., doped with p-type or n-type dopants) or undoped. In some embodiments, the channel layer 106 may be formed by the aforementioned chemical vapor deposition process, molecular beam epitaxy process, liquid phase epitaxy process, another suitable process, or a combination thereof.

In accordance with some embodiments, a barrier layer 108 may be formed on the channel layer 106 to generate a two-dimensional electron gas (2DEG) at the interface between the channel layer 106 and the barrier layer 108. In some embodiments, the material of the barrier layer 108 may include group III-V compound semiconductor materials, such as group III nitrides. For example, in some embodiments, the barrier layer 108 may include aluminum nitride (AlN), aluminum gallium nitride (AlGaN), aluminum indium nitride (AlInN), aluminum gallium indium nitride (AlGaInN), other suitable materials, or a combination thereof. The barrier layer 108 may include a single layer or multilayer structure, and the barrier layer 108 may be doped (e.g., doped with p-type or n-type dopants) or undoped. In some embodiments, the barrier layer 108 may be formed by the aforementioned chemical vapor deposition process, molecular beam epitaxy process, liquid phase epitaxy process, another suitable process, or a combination thereof.

In addition, to simplify the description, the substrate 102, the buffer layer 104, the channel layer 106, and the barrier layer 108 may be collectively referred to as a substrate 101.

In accordance with some embodiments, an isolation structure 110 may be further formed in the substrate 101. Specifically, in some embodiments, a mask layer (not illustrated) may be disposed on the substrate 101, and then the above mask layer may be used as an etching mask to perform an etching process to form a trench in the substrate 101. For example, the mask layer may include a photoresist, such as a positive photoresist or a negative photoresist. In some embodiments, the mask layer may include a hard mask, and the material of the hard mask may include silicon oxide ($SiO_2$), silicon nitride (SiN), silicon oxynitride (SiON), silicon carbide (SiC), silicon carbon nitrogen (SiCN), other suitable materials, or a combination thereof. Furthermore, the masking layer may be a single layer or a multilayer structure. In some embodiments, the mask layer can be formed by a deposition process, a photolithography process, another suitable process, or a combination thereof. In some embodiments, the aforementioned deposition process may include a spin-on coating process, a chemical vapor deposition process, another suitable process, or a combination thereof. In some embodiments, the aforementioned photolithography process may include photoresist coating (e.g., spin coating), soft baking, mask aligning, exposure, post-exposure baking, developing, washing, drying (e.g., hard baking), other suitable processes, or a combination thereof.

In addition, in some embodiments, the aforementioned etching process may include a dry etching process, a wet etching process, or a combination thereof. For example, the dry etching process may include reactive ion etch (RIE), inductively-coupled plasma (ICP) etching, neutral beam etch (NBE), electron cyclotron resonance (ERC) etching, other suitable etching processes, or a combination thereof. For example, hydrofluoric acid (HF), ammonium hydroxide ($NH_4OH$), or other suitable etchant may be used in the wet etching process.

In accordance with some embodiments, an insulating material may then be deposited in the trench to form the isolation structure 110. In some embodiments, the insulating material may be deposited by a metal organic chemical vapor deposition process, an atomic layer deposition process, a molecular beam epitaxy process, a liquid phase epitaxy process, another suitable process, or a combination thereof. In some embodiments, the insulating material may include, for example, oxides such as silicon oxide, nitrides such as silicon nitride, other suitable materials, or a combination thereof.

In accordance with some embodiments, a compound semiconductor layer 112 may then be formed on the barrier layer 108 to deplete the two-dimensional electron gas below the gate structure to achieve a normally-off state of the semiconductor device. In some embodiments, the aforementioned chemical vapor deposition process, molecular beam epitaxy process, liquid phase epitaxy process, another suitable process, or a combination thereof may be used to form the material of the compound semiconductor layer 112 on the barrier layer 108. In some embodiments, the material of the compound semiconductor layer 112 may include u-type, n-type, or p-type doped gallium nitride, and may be doped using a dopant.

In accordance with some embodiments, a patterning process may then be performed to adjust the position of the compound semiconductor layer 112 according to the position where the gate electrode is predetermined to be disposed. In some embodiments, the patterning process may include forming a mask layer (not illustrated) on the material layer forming the compound semiconductor layer 112, and then removing a portion of the material layer that is not covered by the mask layer using etching to form the compound semiconductor layer 112. The details of the material, the forming method, and the etching process of the mask layer are the same as or similar to those described above, and are not repeated herein.

In accordance with some embodiments, a dielectric layer 114 may then be conformally formed on the barrier layer 108, the isolation structure 110, and the compound semiconductor layer 112. In some embodiments, the material of the dielectric layer 114 may include silicon oxide, silicon nitride, silicon oxynitride, aluminum oxide, aluminum nitride, other suitable low-k dielectric materials, or a combination thereof. In some embodiments, the dielectric layer 114 may be formed by the aforementioned chemical vapor deposition process, spin coating process, another suitable process, or a combination thereof.

In accordance with some embodiments, a dielectric layer 116 may then be formed on the dielectric layer 114. In some embodiments, the material and method of forming the dielectric layer 116 may be the same as or similar to the material and method of forming the dielectric layer 114 described above, and thus the details are not repeated herein. In accordance with some embodiments, the dielectric layer 114 and/or the dielectric layer 116 may be provided according to actual needs.

In accordance with some embodiments, a patterning process may be performed on the dielectric layer 114 and the dielectric layer 116 to remove portions of the dielectric layer 114 and the dielectric layer 116 to form an opening that exposes the compound semiconductor layer 112. In some embodiments, the steps of the patterning process may be the same as or similar to the patterning process of the compound semiconductor layer 112 described in detail above, and thus these details are not repeated herein.

In accordance with some embodiments, a gate electrode 118 may then be formed on the dielectric layer 116 and filled into the opening. In some embodiments, the material of the gate electrode 118 may include a conductive material, for example, a metal, a metal silicide, other suitable conductive materials, or a combination thereof. For example, the metal may include gold (Au), nickel (Ni), platinum (Pt), palladium (Pd), iridium (Ir), titanium (Ti), chromium (Cr), tungsten (W), aluminum (Al), copper (Cu), the alloy of the foregoing metals, other suitable materials, or a combination thereof. In some embodiments, the gate electrode 118 may be formed by the aforementioned chemical vapor deposition process, physical vapor deposition process, evaporation process, sputtering process, another suitable process, or a combination thereof.

In accordance with some embodiments, a patterning process may be performed on the gate electrode 118. The steps of the patterning process are the same as those described in detail above, and thus are not repeated herein. As shown in FIG. 1A, in some embodiments, after the patterning process, a maximum width of the gate electrode 118 may be greater than a maximum width of the compound semiconductor layer 112.

Next, referring to FIG. 1B, in accordance with some embodiments, a dielectric layer 120 may be formed on the dielectric layer 116 and the gate electrode 118, and the dielectric layer 116 may entirely cover the gate electrode 118. In some embodiments, the dielectric layer 120 may include silicon oxide, silicon nitride, silicon oxynitride, aluminum oxide, aluminum nitride, other suitable low-k dielectric materials, or a combination thereof. In some embodiments, the dielectric layer 120 may be formed by a chemical vapor deposition process, a spin coating process, another suitable process, or a combination thereof. In some embodiments, after the dielectric layer 120 is deposited, a planarization process such as a chemical mechanical polishing process may be performed on the dielectric layer 120.

In accordance with some embodiments, a patterning process may then be performed on the dielectric layer 120 to remove a portion of the dielectric layer 120 to form a via hole 122 and a via hole 124 in the dielectric layer 120. In some embodiments, the via hole 122 and the via hole 124 may be disposed on both sides of the gate electrode 118, and the via hole 122 and the via hole 124 may expose portions of the channel layer 106. The steps of the patterning process are the same as those described in detail above, and thus are not repeated herein.

Next, in accordance with some embodiments, a patterning process may be performed on the dielectric layer 120 to remove a portion of the dielectric layer 120 to form a first recess 126Ra in the dielectric layer 120. The first recess 126Ra may be adjacent to the gate electrode 118. In some embodiments, the first recess 126Ra may be disposed between the via hole 122 and the via hole 124. In some embodiments, the first recess 126Ra may be closer to the gate electrode 118 than the via hole 122 and the via hole 124. As shown in FIG. 1C, the first recess 126Ra may extend from a top surface 120t of the dielectric layer 120 to a first bottom surface $120b_1$ of the dielectric layer 120, and the first recess 126Ra may not expose the dielectric layer 116.

In some embodiments, the first recess 126Ra may have a depth of $D_1$. In some embodiments, the depth $D_1$ may be a minimum distance between the top surface 120t and the first bottom surface $120b_1$ of the dielectric layer 120. The steps of the patterning process are the same as those described in detail above, and thus are not repeated herein.

Next, referring to FIG. 1D, in accordance with some embodiments, a patterning process may be performed on the dielectric layer 120 again, and another portion of the dielectric layer 120 may be removed to form a second recess 126Rb in the dielectric layer 120. In some embodiments, the first recess 126Ra and the second recess 126Rb may be located between the gate electrode 118 and the drain electrode 134. In some embodiments, the second recess 126Rb may also be disposed between the via hole 122 and the via hole 124. In some embodiments, the second recess 126Rb may be closer to the gate electrode 118 than the via hole 122 and the via hole 124. In some embodiments, the second recess 126Rb may be closer to the gate electrode 118 than the first recess 126Ra.

As shown in FIG. 1D, the second recess 126Rb may extend from the top surface 120t of the dielectric layer 120 to a top surface 116t of the dielectric layer 116 (or a second bottom surface $120b_2$ of the dielectric layer 120). The second recess 126Rb may expose a portion of the top surface 116t of the dielectric layer 116, that is, the second recess 126Rb may penetrate through the dielectric layer 116. In some embodiments, the second bottom surface $120b_2$ of the dielectric layer 120 may be lower than a gate bottom surface 118b of the gate electrode 118. In some embodiments, the second bottom surface $120b_2$ of the dielectric layer 120 may be lower than a top surface (not labeled) of the gate electrode 118. In some embodiments, the second bottom surface $120b_2$ may be a lowermost surface of the dielectric layer 120.

In some embodiments, the second recess 126Rb may have a depth of $D_2$. In some embodiments, the depth $D_2$ may be a minimum distance between the top surface 120t and the second bottom surface $120b_2$ of the dielectric layer 120. In some embodiments, the first bottom surface $120b_1$ may be not aligned with the second bottom surface $120b_2$. In some embodiments, the depth $D_1$ of the first recess 126Ra may be different from the depth $D_2$ of the second recess 126Rb. In some embodiments, the depth $D_1$ of the first recess 126Ra may be smaller than the depth $D_2$ of the second recess 126Rb. The steps of the patterning process are the same as those described in detail above, and thus are not repeated herein.

As shown in FIG. 1D, the first recess 126Ra may be connected to the second recess 126Rb. For example, the first recess 126Ra and the second recess 126Rb may be continuous recesses communicating with each other. In some embodiments, since the depth $D_1$ of the first recess 126Ra is different from the depth $D_2$ of the second recess 126Rb, the first recess 126Ra and the second recess 126Rb may define the recess having a stepped profile. In this embodiment, the stepped profile recess provide a stepped morphology of a source field plate 127 to change the electric field distribution from the drain electrode 134 to the gate electrode 118 to reduce the interference of the electric field on the gate electrode 118. In some embodiments, the depth $D_1$ of the first recess 126Ra may be greater than the depth $D_2$ of the second recess 126Rb. In some embodiments, the depth $D_1$ of the first recess 126Ra may be smaller than the depth $D_2$ of the second recess 126Rb.

However, it should be understood that, although the dielectric layer 120 has a recess with a stepped profile defined by the two recesses, i.e. the first recess 126Ra and the second recess 126Rb in the embodiment shown in the drawings, in accordance with some other embodiments, the dielectric layer 120 may have a recess defined by other suitable numbers of recesses, for example, three, four, five, or other suitable numbers.

Furthermore, in some embodiments, the first recess 126Ra and the second recess 126Rb may divide the dielectric layer 120 into a first portion 119 and a second portion 121, and the first recess 126Ra and the second recess 126Rb may separate the first portion 119 and the second portion 121. In some embodiments, the first portion 119 and the second portion 121 may be disposed on opposite sides of the first recess 126Ra and the second recess 126Rb, respectively. In some embodiments, the first recess 126Ra may not penetrate through the dielectric layer 120, and the second recess 126Rb may penetrate through the dielectric layer 120.

In addition, in some embodiments, the patterning process of the first recess 126Ra and the second recess 126Rb may be performed before, during, or after the patterning process of forming the via hole 122 and the via hole 124. The via hole 124 may be formed before, during or after the via hole 122 is formed, and the second recess 126Rb may be formed before, during or after the first recess 126Ra is formed.

Next, referring to FIG. 1E, in accordance with some embodiments, a source field plate 127 may be conformally formed on the dielectric layer 120, and the source field plate 127 may extend in the first recess 126Ra and the second recess 126Rb. In some embodiments, the source field plate 127 may be in direct contact with the dielectric layer 116 disposed between the gate electrode 118 and the compound semiconductor layer 112. In some embodiments, the source field plate 127 may also extend in the via hole 122. In detail, in some embodiments, the source field plate 127 may extend from a top surface 121t of the second portion 121 to a top surface 119t of the first portion 119 of the dielectric layer 120. In addition, as shown in FIG. 1E, in some embodiments, the source field plate 127 extending into the first recess 126Ra and the second recess 126Rb may include a stepped structure 127S.

On the other hand, in accordance with some embodiments, a conductive layer 128 may be conformally formed on the dielectric layer 120, and the conductive layer 128 may extend in the via hole 124. In some embodiments, the conductive layer 128 may be disposed on a portion of the top surface 119t of the first portion 119.

In some embodiments, the material of the source field plate 127 and the conductive layer 128 may include a conductive material, such as a metal, a metal silicide, another suitable conductive material, or a combination thereof. For example, the metal may include gold (Au), nickel (Ni), platinum (Pt), palladium (Pd), iridium (Ir), titanium (Ti), chromium (Cr), tungsten (W), aluminum (Al), copper (Cu), the alloy of the foregoing metals, other suitable materials, or a combination thereof. In some embodiments, the source field plate 127 and the conductive layer 128 may be formed by the aforementioned chemical vapor deposition process, physical vapor deposition process, evaporation process, sputtering process, another suitable process, or a combination thereof. In addition, in some embodiments, a portion of the conductive material on the first portion 119 of the dielectric layer 120 may be removed by an etching process to expose a portion of the top surface 119t of the first portion 119.

In accordance with some embodiments, the source field plate 127 extending into the first recess 126Ra and the second recess 126Rb can shield the gate electrode 118 and reduce the interference of the electric field on the gate electrode 118. In addition, in accordance with some embodiments, the source field plate 127 with the stepped structure 127S can reduce the number of field plates that need to be disposed subsequently, thereby reducing the risk of parasitic capacitance between the field plate metal layers and simplifying the manufacturing process.

Figure 1F:
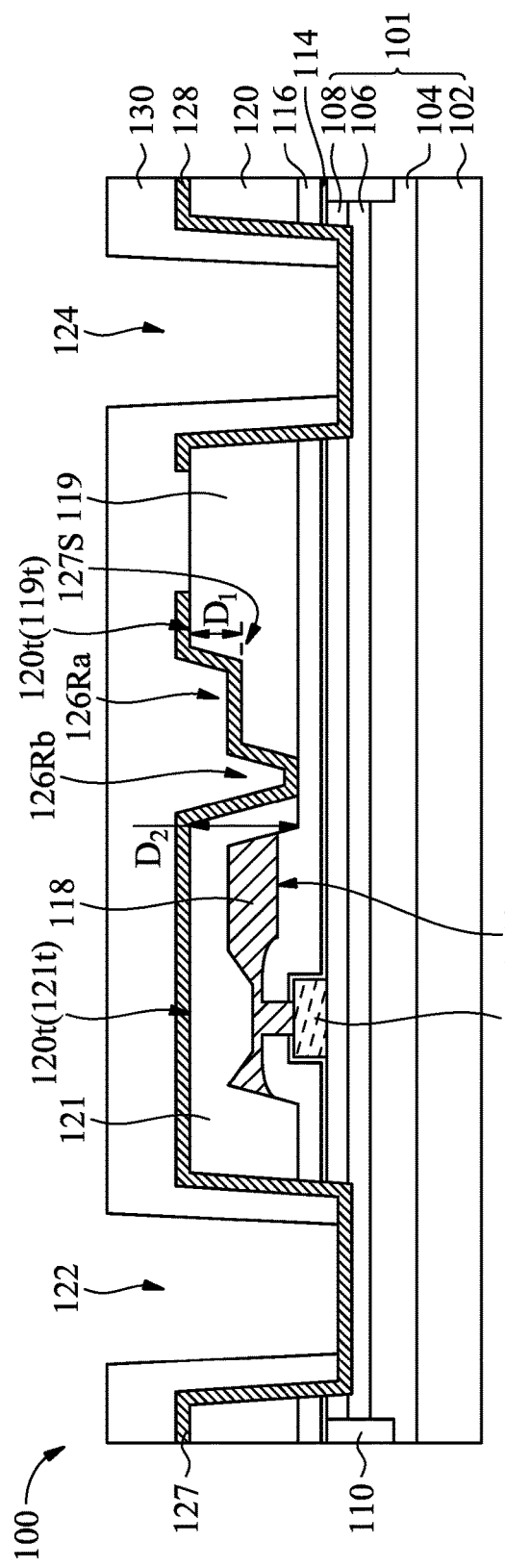

Next, referring to FIG. 1F, in accordance with some embodiments, a dielectric layer 130 may be formed on the source field plate 127 and the conductive layer 128. In some embodiments, the dielectric layer 130 may also be filled in the first recess 126Ra and the second recess 126Rb. In some embodiments, the dielectric layer 130 may be formed by a deposition process, a planarization process, and the like, and the material and the method of forming dielectric layer 130 may be the same as or similar to those of dielectric layer 120, and thus are not repeated herein. In accordance with some embodiments, a patterning process may then be performed on the dielectric layer 130 to form the via hole 122 and the via hole 124 again. The via hole 122 and the via hole 124 may respectively expose portions of the source field plate 127 and the conductive layer 128. The steps of the patterning process are the same as those described in detail above, and thus will not be repeated here.

Figure 1G:
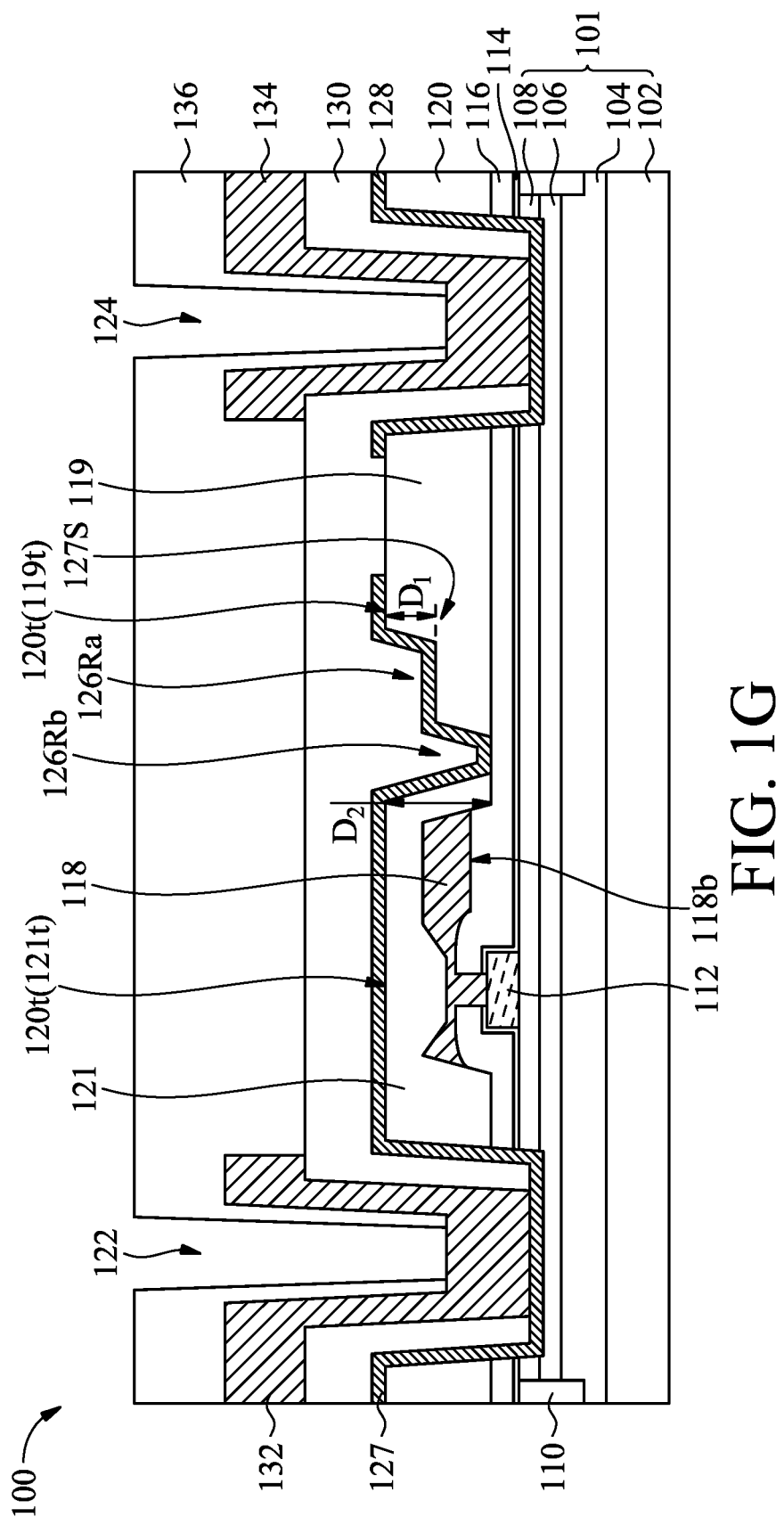

Next, referring to FIG. 1G, in accordance with some embodiments, a source electrode 132 and a drain electrode 134 may be formed on the dielectric layer 130. In some embodiments, the first portion 119 of the dielectric layer 120 may be adjacent to the drain electrode 134 and the second portion 121 of the dielectric layer 120 may be adjacent to the source electrode 132. In some embodiments, the source electrode 132 and the drain electrode 134 may be electrically connected to the source field plate 127 and the conductive layer 128 through the via hole 122 and the via hole 124, respectively. In some embodiments, the drain electrode 134 and the source electrode 132 may be located on opposite sides of the gate electrode 118.

As shown in FIG. 1G, in some embodiments, the aforementioned first recess 126Ra and the second recess 126Rb may be located between the source electrode 132 and the drain electrode 134. In some embodiments, the stepped structure 127S of the source field plate 127 may be disposed between the source electrode 132 and the drain electrode 134. In some embodiments, the source electrode 132 and the gate electrode 118 may not overlap. In some embodiments, the source electrode 132 may not overlap the stepped structure 127S.

In some embodiments, the material of the source electrode 132 and the drain electrode 134 may include a conductive material, such as a metal, a metal silicide, other suitable conductive materials, or a combination thereof. For example, the metal may include gold (Au), nickel (Ni), platinum (Pt), palladium (Pd), iridium (Ir), titanium (Ti), chromium (Cr), tungsten (W), aluminum (Al), copper (Cu), the alloy of the foregoing metals, other suitable materials, or a combination thereof. In some embodiments, the conductive material may be formed by the aforementioned chemical vapor deposition process, physical vapor deposition process, evaporation process, sputtering process, another suitable process, or a combination thereof. In some embodiments, a patterning process may be performed on the conductive material to form the source electrode 132 and the drain electrode 134. The steps of the patterning process are the same as those described in detail above, and thus are not repeated herein.

Next, in accordance with some embodiments, a dielectric layer 136 may be formed on the dielectric layer 130, and the dielectric layer 136 may cover the source electrode 132 and the drain electrode 134. In some embodiments, the dielectric layer 136 may be formed by a deposition process, a planarization process, and the like, and the material and the method of forming the dielectric layer 136 may be the same as or similar to those of the foregoing dielectric layer 120, and thus are not repeated herein. In accordance with some embodiments, a patterning process may then be performed on the dielectric layer 136 to form the via hole 122 and the via hole 124 again. The via hole 122 and via hole 124 may respectively expose portions of the source electrode 132 and the drain electrode 134. The steps of the patterning process are the same as those described in detail above, and thus are not repeated herein.

Figure 1H:
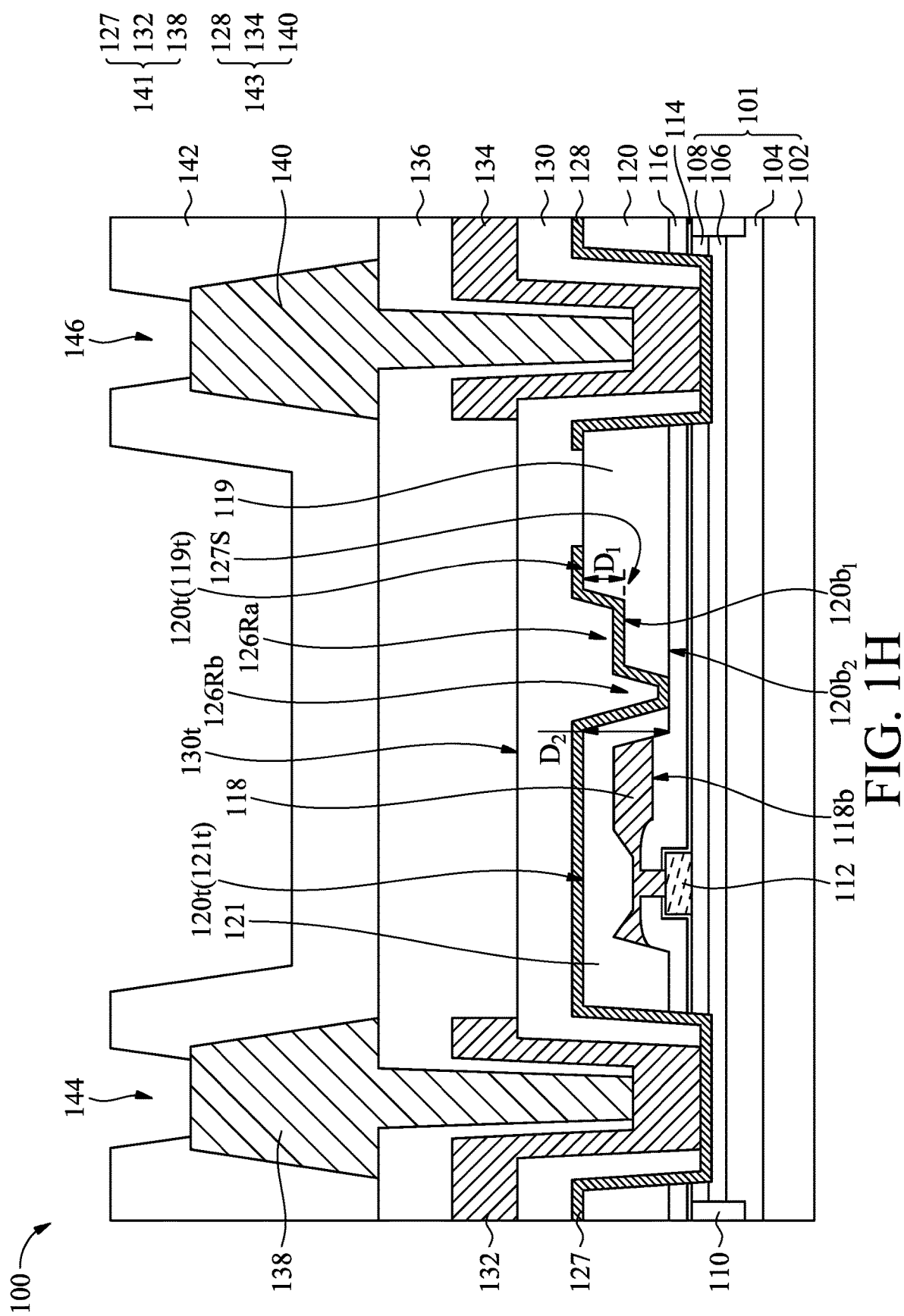

Next, referring to FIG. 1H, in accordance with some embodiments, a source contact 138 and a drain contact 140 may be formed on the dielectric layer 136. In some embodiments, the source contact 138 and the drain contact 140 may penetrate through the dielectric layer 136 and be electrically connected to the source electrode 132 and the drain electrode 134, respectively. In other words, the source contact 138 and the drain contact 140 may be electrically connected to the source electrode 132 and the drain electrode 134 through the via hole 122 and the via hole 124 (as shown in FIG. 1G), respectively.

In some embodiments, the materials of the source contact 138 and the drain contact 140 may include a conductive material, such as a metal, a metal silicide, other suitable conductive materials, or a combination thereof. For example, the metal may include gold (Au), nickel (Ni), platinum (Pt), palladium (Pd), iridium (Ir), titanium (Ti), chromium (Cr), tungsten (W), aluminum (Al), copper (Cu), the alloy of the foregoing metals, other suitable materials, or a combination thereof. In some embodiments, the conductive material may be formed by the aforementioned chemical vapor deposition process, physical vapor deposition process, evaporation process, sputtering process, another suitable process, or a combination thereof. In some embodiments, a patterning process may be performed on the conductive material to form the source contact 138 and the drain contact 140. The steps of the patterning process are the same as those described in detail above, and thus are not repeated herein.

In accordance with some embodiments, a protective layer 142 may be formed on the source contact 138 and the drain contact 140 to block water vapor. In some embodiments, the protective layer 142 may include any suitable dielectric material, for example, silicon oxide, silicon nitride, silicon oxynitride, low-k dielectric material, aluminum oxide, aluminum nitride, other suitable materials, or a combination thereof. In some embodiments, the protective layer 142 may be formed by the aforementioned chemical vapor deposition process, spin coating process, another suitable process, or a combination thereof. Thereafter, in accordance with some embodiments, a patterning process may be performed on the protective layer 142 to form an opening 144 and an opening 146, and the opening 144 and the opening 146 may respectively expose the source contact 138 and the drain contact 140.

In order to simplify the description, the source field plate 127, the source electrode 132, and the source contact 138 may be collectively referred to as a source structure 141, and the conductive layer 128, the drain electrode 134, and the drain contact 140 may be collectively referred to as a drain structure 143.

In accordance with some embodiments, as shown in FIG. 1H, the source field plate 127 located in the first recess 126Ra and the second recess 126Rb has a stepped structure 127S, and the source field plate 127 covers the second portion 121 of the dielectric layer 120. Such a configuration can reduce the effect of the electric field from the drain structure 143 on the gate electrode 118 and can absorb the charge accumulation caused by the interface leakage current. In a preferred embodiment, the second bottom surface $120b_2$ may be lower than the bottom surface $118t$ of the gate electrode 118.

In addition, in accordance with some embodiments, since the source field plate 127 having the stepped structure 127S can effectively shield the electric field influence of the drain structure 143, it is not necessary to provide an additional field plate structure on a top surface $130t$ of the dielectric layer 130. For example, the source electrode 132 does not need to further extend on the top surface $130t$ to overlap the gate electrode 118. In this way, the risk of a large amount of capacitance generated between the gate electrode 118 and other field plate structures can also be reduced, and the manufacturing process can be simplified.

Figure 2:
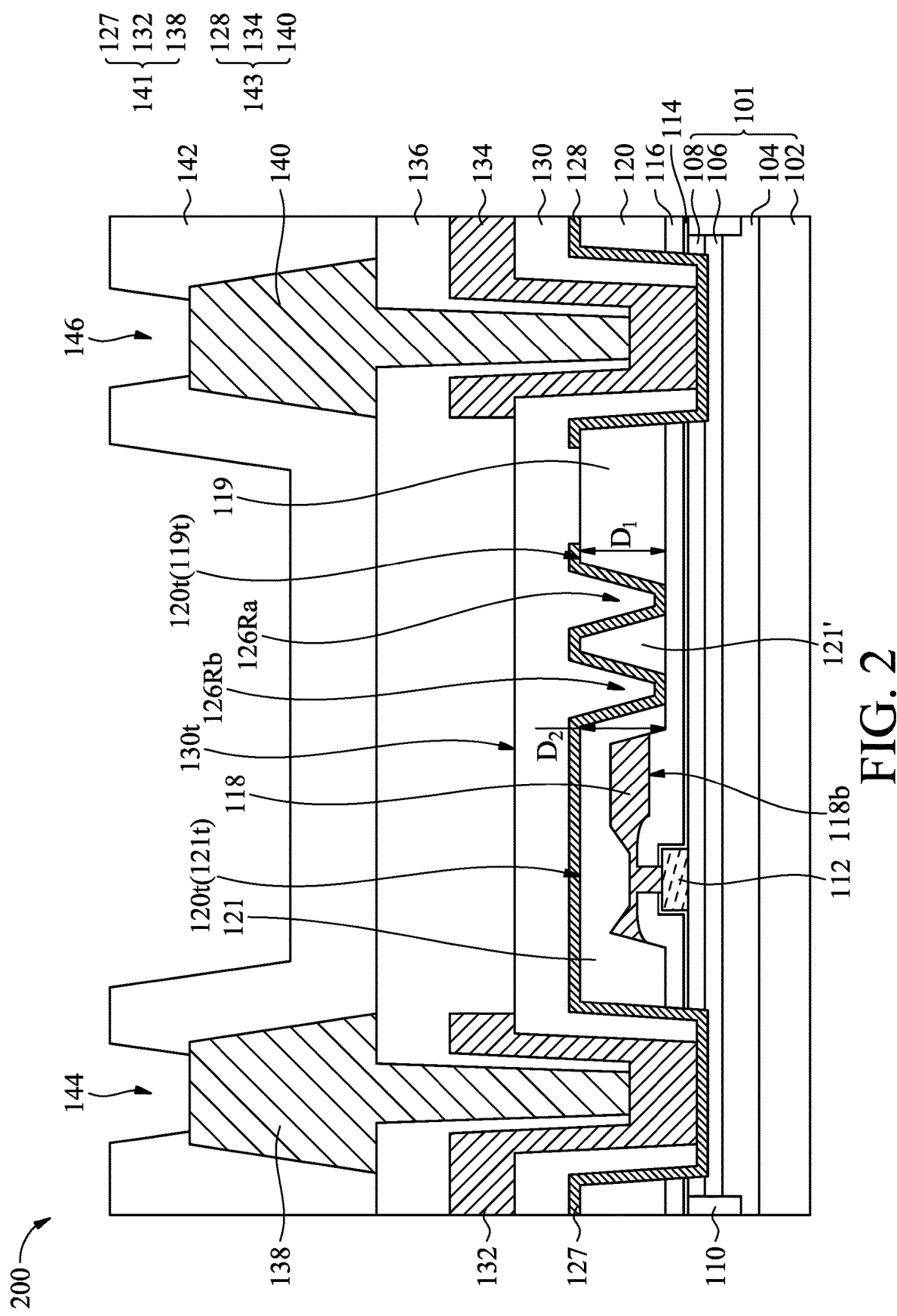
FIG. 2 is a schematic cross-sectional diagram of a semiconductor device in accordance with some embodiments of the present disclosure.

Next, refer to FIG. 2, which is a schematic cross-sectional diagram of a semiconductor device 200 in accordance with some other embodiments of the present disclosure. The semiconductor device 200 shown in FIG. 2 is substantially similar to the semiconductor device 100 shown in FIG. 1H. The difference between them includes that, in the semiconductor device 200, the first recess 126Ra and the second recess 126Rb may be separated by a distance and a portion of the dielectric layer (the third portion 121') may be disposed between the first recess 126Ra and the second recess 126Rb. In this embodiment, the first recess 126Ra and the second recess 126Rb may be discontinuous (or disconnected). In other words, in this embodiment, the first recess 126Ra and the second recess 126Rb may not communicate with each other. In this embodiment, the depth of the first recess 126Ra may be greater than, equal to, or less than the depth of the second recess 126Rb.

Furthermore, in this embodiment, the first recess 126Ra and the second recess 126Rb may divide the dielectric layer 120 into a first portion 119, a second portion 121, and a third portion 121', and the first recess 126Ra and the second recess 126Rb may separate the first portion 119, the second portion 121, and the third portion 121' from one another. Moreover, in this embodiment, both the first recess 126Ra and the second recess 126Rb may penetrate through the dielectric layer 120.

In accordance with some embodiments of the present disclosure, a semiconductor device is provided. The semiconductor device includes a substrate, a gate electrode, a dielectric layer, a source field plate, a second dielectric layer, a source electrode, and a drain electrode. The gate electrode is disposed on the substrate. The first dielectric layer is disposed on the gate electrode and has a first recess and a second recess. The source field plate is disposed on the first dielectric layer and extends into the first recess and the second recess. The second dielectric layer is disposed on the source field plate. The source electrode is disposed on the second dielectric layer and electrically connected to the source field plate. The drain electrode is disposed on the second dielectric layer, and the drain electrode and the source electrode are disposed on opposite sides of the gate electrode, and the first recess and the second recess are located between the gate electrode and the drain electrode.

In some embodiments, the first recess penetrates through the first dielectric layer, and the second recess does not penetrate through the first dielectric layer. In some embodiments, the first recess and the second recess respectively have a first bottom surface and a second bottom surface, the gate electrode has a gate bottom surface, and the first bottom surface and/or the second bottom surface are closer to the substrate than the gate bottom surface.

In some embodiments, the source field plate includes a stepped structure, and the stepped structure is disposed in the first recess and the second recess. In some embodiments, the source electrode does not overlap the stepped structure. In some embodiments, the stepped structure is disposed between the source electrode and the drain electrode.

In some embodiments, the depth of the first recess is different from the depth of the second recess. In some embodiments, the first recess and the second recess are connected. In some embodiments, the source electrode and the gate electrode do not overlap.

In some embodiments, the aforementioned semiconductor device further includes a third dielectric layer, and the third dielectric layer is disposed on the second dielectric layer and covers the source electrode and the drain electrode. In some embodiments, the foregoing semiconductor device further includes a source contact and a drain contact. The source contact and the drain contact are disposed on the third dielectric layer, wherein the source contact and the drain contact penetrate through the third dielectric layer and are electrically connected to the source electrode and the drain electrode, respectively. In some embodiments, the foregoing semiconductor device further includes a fourth dielectric layer, and the fourth dielectric layer is disposed between the gate electrode and the semiconductor substrate, wherein the source field plate is in direct contact with the fourth dielectric layer.

In some embodiments, the first dielectric layer includes a first portion and a second portion, and the first recess and the second recess separate the first portion and the second portion. In some embodiments, the first portion is adjacent to the drain electrode, the second portion is adjacent to the source electrode, and the source field plate extends from the second portion to the first portion. In some embodiments, the source field plate extends from the top surface of the second portion to the top surface of the first portion.

In accordance with some embodiments of the present disclosure, a method for forming a semiconductor device is provided, including the following steps: providing a semiconductor substrate; forming a gate electrode on the semiconductor substrate; forming a first dielectric layer on the gate electrode; removing a portion of the first dielectric layer to form a first recess in the first dielectric layer; removing another portion of the first dielectric layer to form a second recess in the first dielectric layer; conformally forming a source field plate on the first dielectric layer, wherein the source field plate extends into the first recess and the second recess; forming a second dielectric layer on the source field plate; forming a source electrode on the second dielectric layer, wherein the source electrode is electrically connected to the source field plate; and forming a drain electrode on the second dielectric layer, wherein the drain electrode and the source electrode are located on opposite sides of the gate electrode, and the first recess and the second recess are located between the gate electrode and the drain electrode.

In some embodiments, the first recess and the second recess are connected, and the depth of the first recess is different from the depth of the second recess. In some embodiments, the source field plate extending into the first recess and the second recess includes a stepped structure. In some embodiments, the second recess penetrates through the first dielectric layer.

In some embodiments, the foregoing method for forming a semiconductor device further includes: forming a third dielectric layer on the second dielectric layer and covering the source electrode and the drain electrode; and forming a source contact and a drain contact on the third dielectric layer, wherein the source contact and the drain contact penetrate through the third dielectric layer and are electrically connected to the source electrode and the drain electrode, respectively.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The scope of protection of present disclosure is subject to the definition of the scope of the appended claims.

What is claimed is:

1. A semiconductor device, comprising:
   a substrate;
   a gate electrode disposed on the substrate;
   a first dielectric layer disposed on the gate electrode and having a first recess and a second recess;
   a source field plate disposed on the first dielectric layer and extending into the first recess and the second recess;
   a second dielectric layer disposed on the source field plate;
   a source electrode disposed on the second dielectric layer and electrically connected to the source field plate; and
   a drain electrode disposed on the second dielectric layer, and the drain electrode and the source electrode are disposed on opposite sides of the gate electrode, wherein the first recess and the second recess are located between the gate electrode and the drain electrode.

2. The semiconductor device as claimed in claim 1, wherein the first recess does not penetrate through the first dielectric layer, and the second recess penetrates through the first dielectric layer.

3. The semiconductor device as claimed in claim 1, wherein the first recess and the second recess respectively have a first bottom surface and a second bottom surface, and the gate electrode has a gate bottom surface, wherein the first bottom surface and/or the second bottom surface is closer to the substrate than the gate bottom surface.

4. The semiconductor device as claimed in claim 1, wherein the source field plate comprises a stepped structure, and the stepped structure is disposed in the first recess and the second recess.

5. The semiconductor device as claimed in claim 4, wherein the source electrode does not overlap the stepped structure.

6. The semiconductor device as claimed in claim 1, wherein the first recess and the second recess are not connected.

7. The semiconductor device as claimed in claim 6, wherein a depth of the first recess is different from or the same as a depth of the second recess.

8. The semiconductor device as claimed in claim 1, wherein the first recess and the second recess are connected.

9. The semiconductor device as claimed in claim 8, wherein a depth of the first recess is different from a depth of the second recess.

10. The semiconductor device as claimed in claim 1, wherein the source electrode and the gate electrode do not overlap.

11. The semiconductor device as claimed in claim 1, further comprising a third dielectric layer disposed on the second dielectric layer and covering the source electrode and the drain electrode.

12. The semiconductor device as claimed in claim 11, further comprising a source contact and a drain contact disposed on the third dielectric layer, wherein the source contact and the drain contact penetrate through the third dielectric layer and are electrically connected to the source electrode and the drain electrode, respectively.

13. The semiconductor device as claimed in claim 11, further comprising a fourth dielectric layer disposed between the gate electrode and the substrate, wherein the source field plate is in direct contact with the fourth dielectric layer.

14. The semiconductor device as claimed in claim 1, wherein the first dielectric layer comprises a first portion and a second portion, and the first recess and the second recess separate the first portion from the second portion.

15. The semiconductor device as claimed in claim 14, wherein the first portion is adjacent to the drain electrode, the second portion is adjacent to the source electrode, and the source field plate extends from the second portion to the first portion.

16. The semiconductor device as claimed in claim 15, wherein the source field plate extends from a top surface of the second portion to a top surface of the first portion.

17. A method for forming a semiconductor device, comprising:
    providing a substrate;
    forming a gate electrode on the substrate;
    forming a first dielectric layer on the gate electrode;
    removing a portion of the first dielectric layer to form a first recess in the first dielectric layer;
    removing another portion of the first dielectric layer to form a second recess in the first dielectric layer;
    conformally forming a source field plate on the first dielectric layer, wherein the source field plate extends into the first recess and the second recess;
    forming a second dielectric layer on the source field plate;
    forming a source electrode on the second dielectric layer, wherein the source electrode is electrically connected to the source field plate; and
    forming a drain electrode on the second dielectric layer, wherein the drain electrode and the source electrode are located on opposite sides of the gate electrode, and the first recess and the second recess are located between the gate electrode and the drain electrode.

18. The method for forming a semiconductor device as claimed in claim 17, wherein the first recess and the second recess are connected, and a depth of the first recess is different from a depth of the second recess.

19. The method for forming a semiconductor device as claimed in claim 17, wherein the source field plate extending into the first recess and the second recess comprises a stepped structure.

20. The method for forming a semiconductor device as claimed in claim 17, wherein the first recess does not penetrate through the first dielectric layer, and the second recess penetrates through the first dielectric layer.

21. The method for forming a semiconductor device as claimed in claim 17, further comprising:
    forming a third dielectric layer on the second dielectric layer and covering the source electrode and the drain electrode; and
    forming a source contact and a drain contact on the third dielectric layer, wherein the source contact and the drain contact penetrate through the third dielectric layer and are electrically connected to the source electrode and the drain electrode, respectively.

* * * * *